United States Patent [19]

Newman

[11] Patent Number: 5,208,188
[45] Date of Patent: May 4, 1993

[54] PROCESS FOR MAKING A MULTILAYER LEAD FRAME ASSEMBLY FOR AN INTEGRATED CIRCUIT STRUCTURE AND MULTILAYER INTEGRATED CIRCUIT DIE PACKAGE FORMED BY SUCH PROCESS

[75] Inventor: Robert A. Newman, Santa Clara, Calif.

[73] Assignee: Advanced Micro Devices, Inc., Sunnyvale, Calif.

[21] Appl. No.: 822,330

[22] Filed: Jan. 15, 1992

Related U.S. Application Data

[60] Continuation-in-part of Ser. No. 710,416, Jun. 5, 1991, which is a division of Ser. No. 415,844, Oct. 2, 1989, Pat. No. 5,068,708.

[51] Int. Cl.$^5$ ............................................ H01L 21/60
[52] U.S. Cl. ................................. 437/220; 437/209; 437/217; 257/668; 257/675
[58] Field of Search .................. 437/205, 217, 220; 357/70, 74

[56] References Cited

U.S. PATENT DOCUMENTS

| | | | |
|---|---|---|---|
| 4,446,477 | 5/1984 | Currie et al. | 357/74 |
| 4,594,770 | 6/1986 | Butt | 437/220 |
| 4,870,474 | 9/1989 | Karashima | 357/70 |
| 5,073,521 | 12/1991 | Braden | 437/217 |
| 5,093,989 | 3/1992 | Beltz | 637/220 |

Primary Examiner—Brian E. Hearn
Assistant Examiner—Kevin M. Picardat
Attorney, Agent, or Firm—John P. Taylor

[57] ABSTRACT

A method is described for making a multilayer lead frame assembly for an integrated circuit die package comprising a planar metal lead frame; at least one layer of insulating tape, provided with a b-stage adhesive on each surface thereof; and a planar metal member capable of functioning as a ground plane layer and as a heat sink. The method comprises: bonding the planar metal lead frame, one or more insulating tapes, and planar metal member together as a multilayer lead frame assembly prior to mounting the integrated circuit die to the resulting multilayer lead frame assembly. The planar metal member and planar lead frame are respectively bonded to a surface of the insulating tape by bringing the metal member (or lead frame) into contact with the b-stage adhesive on the surface of the insulating tape and then heating the metal member (or lead frame) and the insulating tape to the curing temperature of the b-stage adhesive to bond the metal member (or lead frame) to the insulating tape. After assembly of the multilayer lead frame assembly, the integrated circuit die may be subsequently bonded to a surface of an insulating layer in the same manner or the die may be bonded directly to a surface of either the lead frame or the metal member using a conductive adhesive.

24 Claims, 5 Drawing Sheets

FORMING A MULTILAYER LEAD FRAME ASSEMBLY BY FIRST BONDING A PLANAR METAL LEAD FRAME TO ONE SURFACE OF AN INSULATING TAPE HAVING A FIRST B-STAGE ADHESIVE ON ONE SURFACE BY PLACING THE LEAD FRAME IN CONTACT WITH THE B-STAGE ADHESIVE AND HEATING THE LEAD FRAME AND INSULATING TAPE TO THE CURING TEMPERATURE OF THE B-STAGE ADHESIVE TO FORM THE BOND

THEN BONDING A METAL MEMBER, CAPABLE OF SERVING AS BOTH A GROUND PLANE AND A HEAT SINK, TO AN OPPOSITE SURFACE OF THE INSULATING TAPE BY PLACING THE METAL MEMBER IN CONTACT WITH A SECOND B-STAGE ADHESIVE ON THE OPPOSITE SURFACE OF THE INSULATING LAYER AND THEN HEATING THE INSULATING TAPE AND METAL MEMBER TO THE CURING TEMPERATURE OF THE SECOND B-STAGE ADHESIVE TO BOND THE METAL MEMBER TO THE OPPOSITE SURFACE OF THE INSULATING LAYER

THEN BONDING AN INTEGRATED CIRCUIT DIE TO THE RESULTING MULTILAYER LEAD FRAME ASSEMBLY

THEN ENCAPSULATING THE DIE AND MULTILAYER LEAD FRAME ASSEMBLY IN A PLASTIC ENCAPSULATING MATERIAL

FIG. 12

PROCESS FOR MAKING A MULTILAYER LEAD FRAME ASSEMBLY FOR AN INTEGRATED CIRCUIT STRUCTURE AND MULTILAYER INTEGRATED CIRCUIT DIE PACKAGE FORMED BY SUCH PROCESS

CROSS REFERENCE TO RELATED APPLICATIONS

This application is a continuation-in-part of Newman Ser. No. 07/710,416, filed Jun. 5, 1991 as a division of Newman Ser. No. 07/415,844, filed Oct. 2, 1989 and now issued as U.S. Pat. No. 5,068,708.

BACKGROUND OF THE INVENTION

1. Field of the Invention

This invention relates to a process for making a multilayer lead frame assembly for an integrated circuit structure and a multilayer plastic encapsulated integrated circuit die package made by such a process. More particularly, this invention relates to formation of a multilayer lead frame assembly for an integrated circuit structure including a metal ground plane which is capable of also providing heat dissipation and mechanical support for the package as it is being formed.

2. Description of the Related Art

In the packaging of integrated circuit structures, it is known to provide metal portions adjacent the integrated circuit die which electrically function as ground planes to reduce inductance, and thereby speed the performance of the device, as well as to provide a heat sink or dissipation means.

For example, Andrews U.S. Pat. No. 4,147,889 discloses a chip carrier comprising a printed circuit board having a metal layer formed on each surface. The metal layer on one surface comprises an external heat sink of substantial surface area while the metal layer on the side to which the chip is bonded is patterned to form lead fingers and a central metal heat sink to which the chip is bonded. According to the patentees, holes may be provided through the printed circuit board which are subsequently filled with metal to provide a direct metal contact between the heat sink to which the chip is bonded and the external heat sink.

Butt U.S. Pat. No. 4,410,927 teaches a casing for an electrical component such as an integrated circuit die with a metal base member onto which the die is bonded using an epoxy adhesive. A lead frame is also sealed and bonded to the metal base member. A housing member is peripherally mounted on the base member to form an enclosed casing over the die.

Daniels et al U.S. Pat. No. 4,680,613 discloses a low impedance package for an integrated circuit die comprising a lead frame without a central paddle and a ground plate which forms the die attach plane and which is spaced from and parallel to the lead frame. A dielectric layer is formed between the lead frame and the ground plate.

Katagiri Japanese Patent document 59-207645 discloses a semiconductor device and lead frame wherein a heat dissipating plate is connected to a semiconductor chip through a mounting agent which is a good heat conductor. After connecting the chip to leads via wires, the chip and leads are sealed by a resin mold layer so that the surface of the heat dissipating plate is exposed.

Currie et al. U.S. Pat. No. 4,446,477 discloses a multilayer assembly containing a ground plane and several layers of signal direction lines separated from one another by polyimide insulating layers and electrically connected by lead out pin vias to an array of lead out pins positioned perpendicular to the multilayer assembly.

Usually, however, it is more difficult to incorporate a metal ground plane/heat sink into a plastic-encapsulated integrated circuit package because of the difficulty of orienting and mechanically assembling together the integrated circuit die, lead frame, and ground plane/heat sink prior to the encapsulation step which will then serve to provide the mechanical bonding together of the components comprising the package.

It would, therefore be desirable to provide a plastic-encapsulated integrated circuit package comprising a multilayer lead frame assembly which incorporates therein a metal member capable of functioning as an electrical ground plane and thermal heat sink and a method of assembling such a structure which will provide a mechanically stable and strong structure prior to encapsulation.

SUMMARY OF THE INVENTION

The invention provides a method for making a multilayer lead frame assembly for an integrated circuit die package comprising a planar metal lead frame; at least one layer of insulating tape provided with a b-stage adhesive on each surface thereof; and a planar metal member capable of functioning as a ground plane layer and as a heat sink. The method comprises: bonding the planar metal lead frame, one or more insulating tapes, and planar metal member together as a multilayer lead frame assembly prior to mounting the integrated circuit die to the resulting multilayer lead frame assembly.

The planar metal member and planar lead frame are respectively bonded to a surface of the insulating tape by bringing the metal member (or lead frame) into contact with the b-stage adhesive on the surface of the insulating tape and then heating the metal member (or lead frame) and the insulating tape to the curing temperature of the b-stage adhesive to bond the metal member (or lead frame) to the insulating tape. After assembly of the multilayer lead frame assembly, the integrated circuit die may be subsequently bonded to a surface of an insulating tape in the same manner or the die may be bonded directly to a surface of either the lead frame or the metal member using a conductive adhesive.

The invention will be more fully understood by the following description and accompanying drawings.

BRIEF DESCRIPTION OF THE DRAWINGS

FIG. 12 is a flow sheet illustrating the process of the invention.

DETAILED DESCRIPTION OF THE INVENTION

Figure 1:
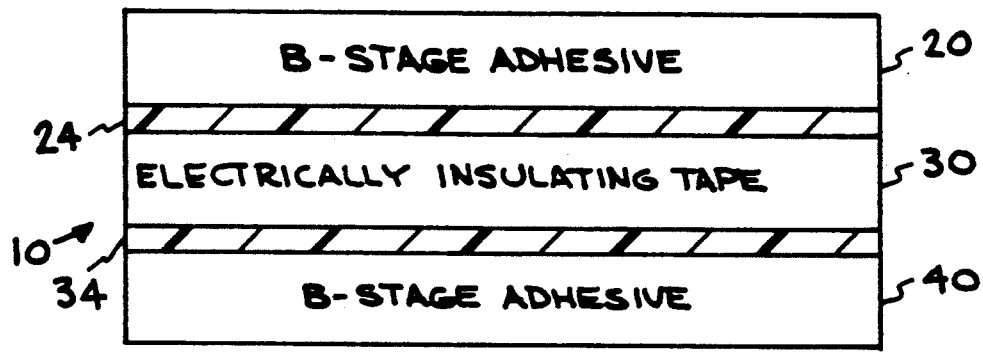
FIG. 1 is a vertical cross-sectional view showing an insulating tape using in the process of the invention for making the multilayer lead frame assembly, with a b-stage adhesive shown formed on both surfaces of the insulating tape.

Referring now to FIG. 1, a three layer insulating tape assembly 10 is generally indicated comprising a first b-stage adhesive layer 20 bonded to one side or surface of an insulating layer or tape 30 and a second b-stage adhesive layer 40 bonded to the opposite side or surface of insulating layer or tape 30. The representation of these layers depicted in the figures will be understood to not be in scale, with the thickness of some of the layers exaggerated for illustrative purposes.

In FIG. 1, b-stage adhesive layers 20 and 40 are respectively shown as bonded to the opposite surfaces of insulating tape 30 by adhesives 24 and 34. As will be explained in more detail below, the use of such additional adhesives is only optional and may be used for convenience in temporarily adhering respective b-stage adhesive layers 20 and 40 to tape 30 prior to heating and curing b-stage adhesive layers 20 and 40.

When an adhesive is used to bond either b-stage adhesive layers 20 and/or 40 to electrically insulating film 30, a high temperature-resistant adhesive may preferably be used for adhesive 24 and/or 34, i.e., an adhesive capable of withstanding the high temperatures used to cure the b-stage adhesives. An example of such a high temperature-resistant adhesive is CL101, a high temperature epoxy adhesive available from the Chomerics company which is capable of withstanding temperatures as high as 300° C.

Insulating tape layer 30 comprises a material which will provide electrical insulation between the lead frame and the metal member to be subsequently bonded to layer 30 as will be explained below. Insulating layer 30 ranges in thickness from about 1 to about 3 mils, and preferably comprises a polyimide film such as, for example, Kapton. Insulating layer 30, while exhibiting electrical insulation properties, may also function as a heat conductor. Such materials are commercially available, for example, as alumina-filled polyimide films.

The b-stage adhesive film layers 20 and 40 comprises cross-linkable adhesive resins, such as an epoxy adhesive or equivalent adhesive, which has been partially cured or crosslinked to a degree where it resembles cheese in that it is a non-sticky solid which is still flexible and capable of further curing, as well as adherence to other materials upon application of heat to assembly 10. Other such b-stage adhesives equivalent to b-stage epoxy adhesives include cross-linkable polyimide, phenolic rubber, and polyester resins previously cured to a b-stage.

The thickness of b-stage adhesive layers 20 and 40 generally ranges from about 1 to about 3 mils. An example of a commercially available b-stage epoxy resin which may be used in the practice of the invention is Amicon C990 epoxy resin (w/o silver flake filler) available from Emerson and Cuming, Inc., a division of W. R. Grace and Company.

In accordance with one aspect of the invention, as will be explained in more detail below, to permit independent bonding of the planar metal lead frame and the metal member capable of serving as both a ground plane and heat sink to opposite surfaces of insulating tape 30, b-stage adhesive layers 20 and 40 are preselected to be curable at different temperatures. For example, b-stage adhesive layer 20 may be curable at a temperature of 175° C., while b-stage layer 40 may be curable at 275° C. so that b-stage layer may be used to bond the lead frame to insulating tape layer 30 at a temperature which will not cure b-stage layer 40 to permit independent subsequent bonding of the metal member to the opposite surface of the insulating tape later.

Figure 2:
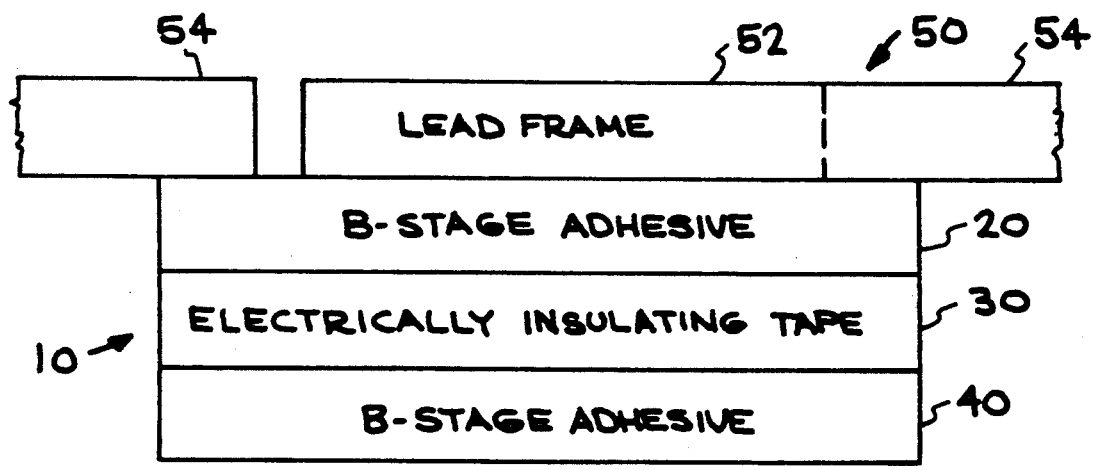
FIG. 2 is a fragmentary vertical cross-sectional view showing the multilayer lead frame assembly of FIG. 1 after the first step of bonding a lead frame to one of the surfaces of the insulating tape.
Figure 4:
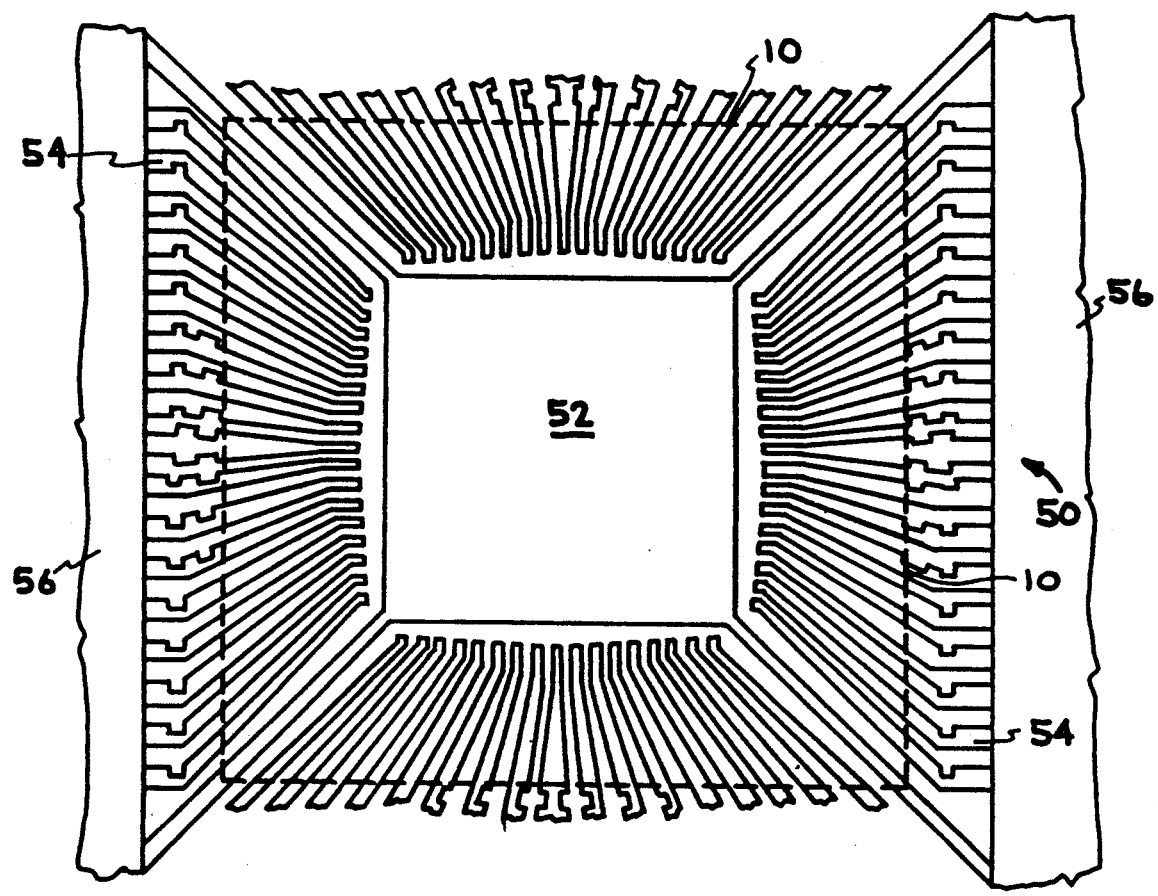
FIG. 4 is a fragmentary top view of the structure of FIG. 2 showing the planar metal lead frame with the insulating tape assembly shown in dotted lines bonded to the underside of the lead frame.
Figure 5:
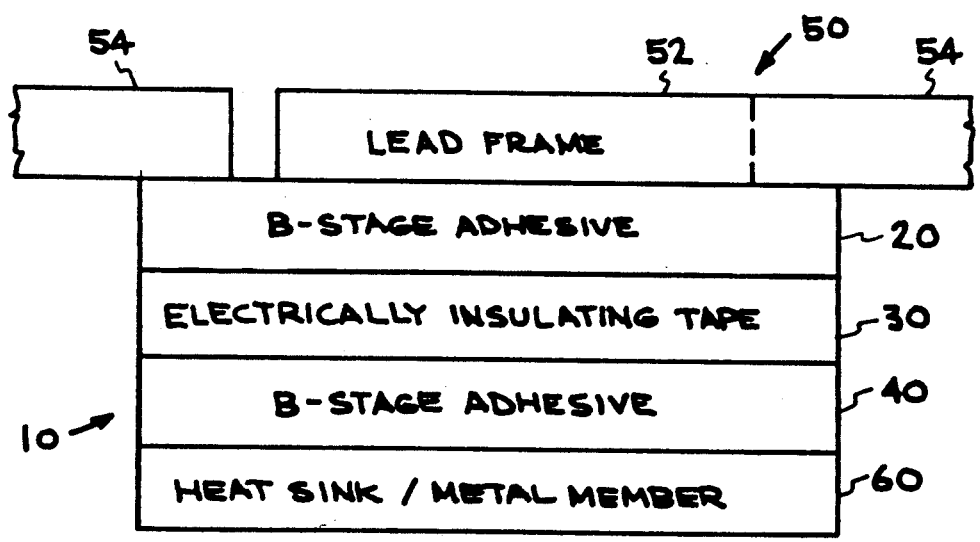
FIG. 5 is a fragmentary vertical cross-sectional view showing the multilayer lead frame assembly of FIG. 1 after the steps of bonding a lead frame and a metal member respectively to both surfaces of the insulating tape.

Referring now to FIG. 2, three layer insulating tape assembly 10 is shown bonded, in a first step, to a conventional planar metal lead frame 50 which, in the embodiment shown in FIGS. 2 and 5, may be provided with a center die paddle 52 and lead fingers 54 which radiate out on all four sides of lead frame 50, as illustrated in FIGS. 2, 4, and 5.

Tape assembly 10 and lead frame 50 are bonded together by bringing one surface of lead frame 50 in contact with b-stage adhesive layer 20 on tape assembly 10 and then heating tape assembly 10 and lead frame 50 to the curing temperature of b-stage adhesive 20, e.g., to about 175° C. As b-stage adhesive layer 20 cures at this temperature, it forms a permanent bond to both insulating layer 30 of tape assembly 10 and lead frame assembly 50. If a high temperature-resistant adhesive has been initially used to bond b-stage layer 20 to insulating tape 30, the curing temperature used to cure b-stage adhesive layer 20 will not affect the bond between b-stage adhesive layer 20 and insulating layer 30. However, if a high temperature adhesive has not been used, the curing of b-stage layer 20 should still result in the formation of a permanent bond between insulating layer 30 and the now cured adhesive layer 20.

It should be noted that it is important to the practice of this invention that planar metal lead frame 50 not be heated (in an oxidizing atmosphere) for a temperature/time period sufficient to oxidize the metal lead frame which is conventionally formed using copper and which is capable of rapidly oxidizing, i.e., within 15–20 seconds at temperatures exceeding 200° C.

The b-stage adhesive layers 20 and 40 and any curable adhesives used, such as, for example, the conductive epoxy resin used as the adhesive to bond the integrated circuit die to die paddle 52 of lead frame 50, may be cured by heating the structure in a nitrogen or other non-oxidizing atmosphere to a temperature to avoid such oxidation of lead frame 50.

It will be noted that in this embodiment, b-stage adhesive layer 40 does not cure at this point in the process since its curing temperature is higher than that of b-stage adhesive layer 20.

Figure 3:
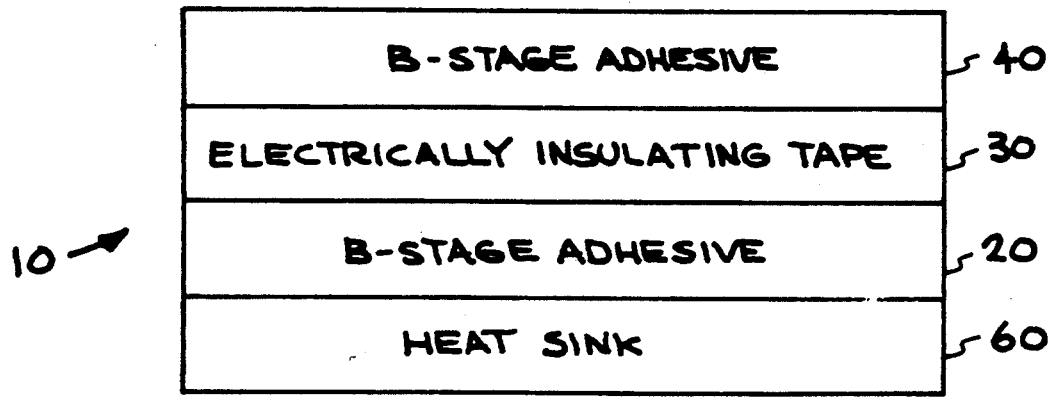
FIG. 3 is a fragmentary vertical cross-sectional view showing the multilayer lead frame assembly of FIG. 1 after alternatively first bonding a metal member to one of the surfaces of the insulating tape.

Alternatively, as shown in FIG. 3, metal member 60 may be first bonded to insulating tape assembly 10 by bringing one surface of metal member 60 into contact with lower curing temperature b-stage adhesive layer 20 and then heating the components to the curing temperature of b-stage adhesive 20.

While either planar metal lead frame 50 or metal member 60 may thus be bonded to insulating tape assembly 10 first, it may be preferable to first bond lead frame 50 to insulating tape assembly 10 when using automated tape feeding facilities to assembly the components together, followed by a subsequent step to bond insulating tape assembly 10 to metal member 60 by bringing metal member 60 into contact with b-stage adhesive layer 40 on the opposite surface of insulating layer 30.

Metal member 60, shown bonded to insulating tape assembly 10 in FIGS. 3 and 5, may comprise any electrically and thermally conductive metal material. Metal member 60 may comprise metals such as for example, copper, aluminum, gold, silver, or an alloy materials such as alloy 42, a nickel-iron alloy. Preferably metal member 60 will comprise copper because of its excellent electrical and thermal conductivity, as well as cost compared to precious metals. Metal member 60 may comprise a metal foil or sheet stock ranging in thickness from about 1.5 to 20 mils. Preferably the thickness will range from about 7 to 12 mils to provide both the desired electrical ground plane as well as providing good heat conductivity. Metal foil in the preferred thickness range is commercially available.

Regardless of whether planar metal lead frame 50 or metal member 60 is bonded to insulating tape assembly 10 first, the other metal component is subsequently brought into contact with higher temperature-curing b-stage adhesive layer on the opposite surface of insulating tape layer 30 and the assembly is heated to the higher curing temperature of b-stage adhesive layer 40, e.g., heated to 275° C. to bond the other metal component to the opposite side or surface of insulating layer 30 resulting in the structure shown in FIG. 5, comprising insulating tape 30 bonded on one side to planar metal lead frame 50 (through b-stage adhesive layer 20—when lead frame 50 is first bonded to insulating tape layer 30) and bonded on the opposite side to metal member 60 (through b-stage adhesive layer 40—when metal member 60 is bonded to insulating layer 30 after lead frame 50 is already bonded to insulating layer 30).

As seen in FIGS. 2, 4, and 5 the area of tape assembly 10 in contact with lead frame 50 is larger than the area of center die paddle 52 so that insulating tape assembly 10 is in contact with, and bonded to, the inner ends of lead frame leads 54, while the area of metal member 60 is the same as that of insulating tape assembly 10. This provides mechanical strength to the bonded together composite assembly of lead frame/insulating tape/metal member after the outer portions 56 of lead frame 50 are severed, as is commonly practiced in the art to thereby electrically isolate the individual leads 54 from one another.

Normally, such a severing operation would not be carried out until after assembly and connection of the integrated circuit die to the lead frame and the encapsulation of the die and lead frame within a plastic encapsulant which provides the needed mechanical stability to permit severance of the outer lead portions of lead frame 50 from leads 54. Formation of the multilayer lead frame/insulating tape/metal member composite in accordance with the invention permits such severing to be carried out, if desired prior to either attachment of the die or encapsulation of the package.

Figure 9:
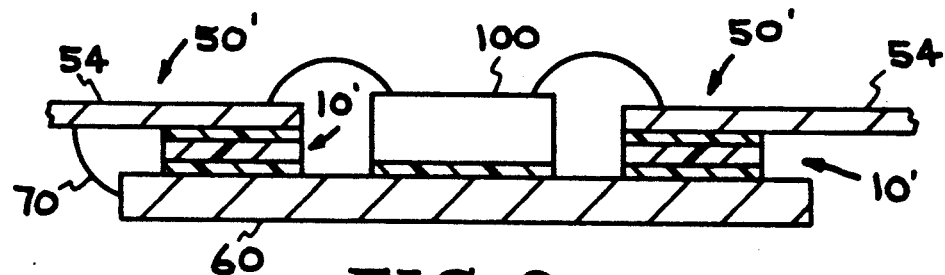
FIG. 9 is a fragmentary vertical cross-sectional view of the multilayer lead frame assembly of FIG. 8 showing an integrated circuit die mounted directly to one surface of the metal member within the central opening formed in the insulating tape and planar metal lead frame.
Figure 10:
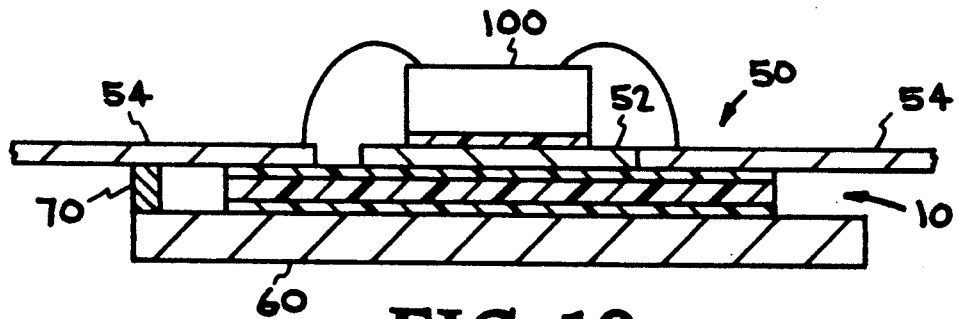
FIG. 10 is a fragmentary vertical cross-sectional view of the multilayer lead frame assembly of FIG. 4 showing an integrated circuit die bonded directly to a central portion of one surface of the lead frame with one of the leads on the lead frame shown electrically connected to the metal member.
Figure 11:
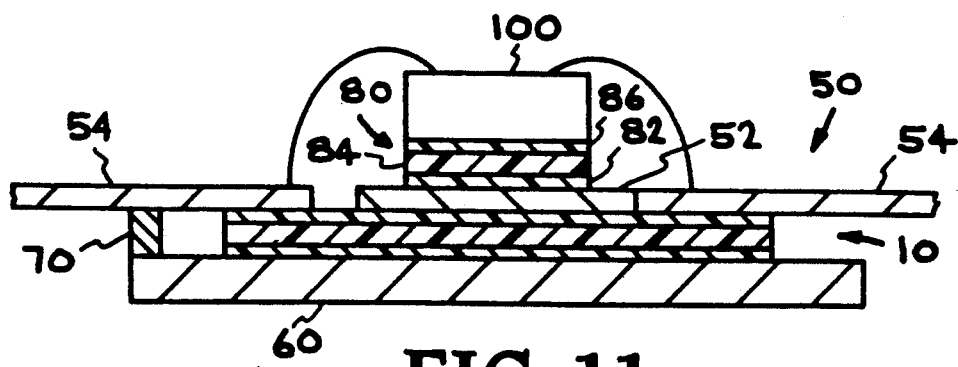
FIG. 11 is a fragmentary vertical cross-sectional view of a multilayer lead frame assembly such as shown in FIG. 4 with a second insulating tape bonded to the opposite surface of the planar metal lead frame and an integrated circuit bonded to the opposite surface of the second insulating tape.

Following the assembly of the multilayer lead frame composite assembly, comprising insulating tape assembly 10, planar metal lead frame 50, and metal member 60, an integrated circuit die 100 may be bonded directly to central die paddle 52, preferably using a conductive adhesive such as an epoxy adhesive, resulting in the structure shown in FIG. 10. Electrical connection of the inner ends of the respective leads 54 to the appropriate die pads on die 100 may now be conventionally made using bond wires. This is usually accomplished with an automatic wire bonder such as, for example, a K&S 1482 gold wire bonder, available from Kulicke and Soffa Industries, Inc. Such lead attachment may include the formation of an electrical connection between one of the leads and metal member 60, as shown at 70, to provide, for example, a ground plane in metal member 60. Electrical connection 70 may comprise an actual wire lead (as shown in the embodiment of FIG. 9) or it may comprise an electrically conductive bridge formed by using a conductive plastic material, e.g., a conductive epoxy, along the edge of the multilayer assembly between one of the leads and metal member 60, as shown in the embodiments of FIGS. 10 and 11.

The structure may then be encapsulated in plastic to complete the assembly of the plastic integrated circuit die package. The structure may be encapsulated in an epoxy novalac plastic encapsulating material 80 such as Sumitomo 6300H.

Figure 6:
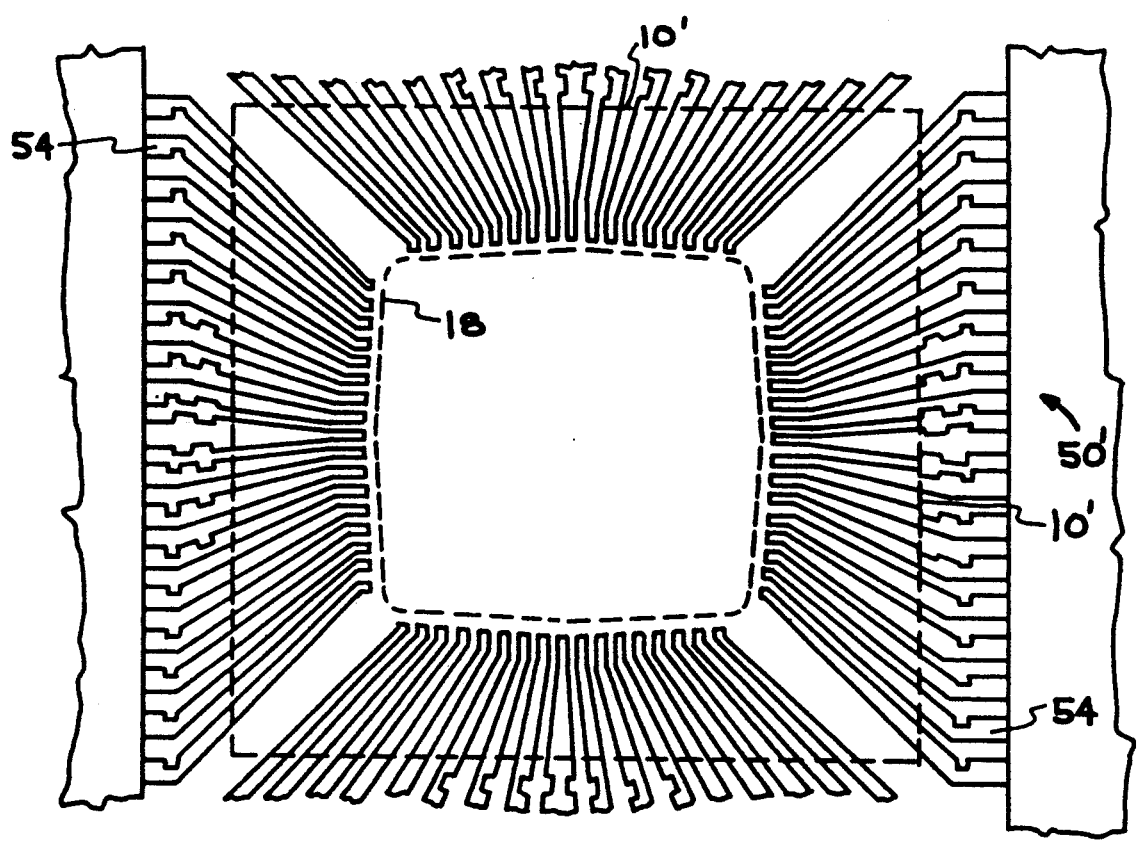
FIG. 6 is a fragmentary top view of another embodiment of the multilayer lead frame assembly similar to the embodiment of FIGS. 2 and 4 except that a central portion of both the insulating tape layer and the lead frame are removed to permit attachment of the integrated circuit die directly to one surface of the metal member.
Figure 7:
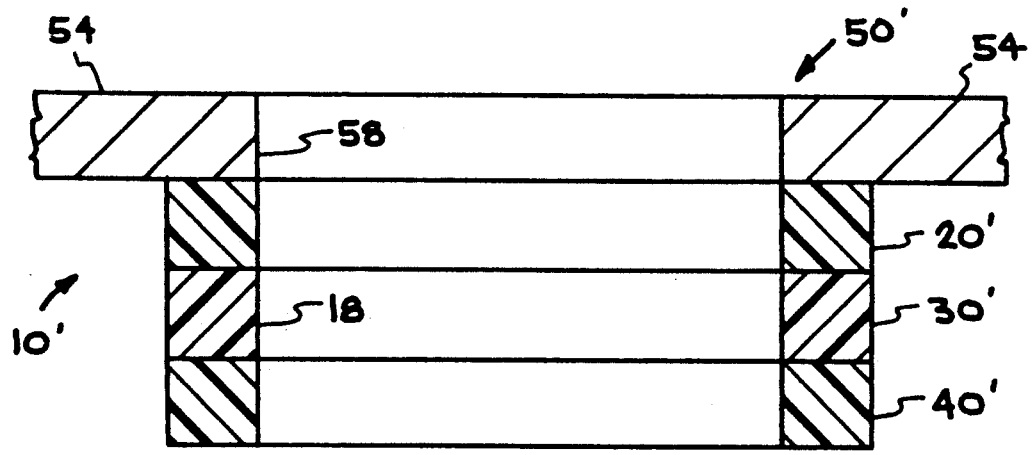
FIG. 7 is a fragmentary vertical cross-sectional view of the multilayer lead frame assembly of FIG. 6, showing the planar metal lead frame and insulating tape assembly bonded together.
Figure 8:
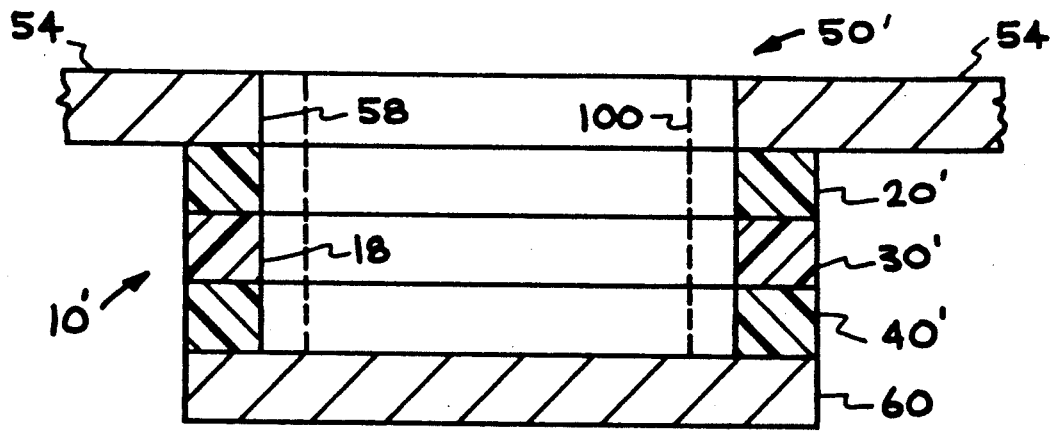
FIG. 8 is a fragmentary vertical cross-sectional view of the multilayer lead frame assembly of FIGS. 6 and 7 after bonding the metal member to the assembly.

Turning now to FIGS. 6–8, another embodiment of the process is illustrated wherein central die paddle 52 on planar metal lead frame 50' is removed, either during or prior to the bonding of lead frame 50' to insulating tape assembly 10', leaving an opening 58 therein. A corresponding opening 18 is provided in insulating tape assembly 10', conveniently by a punching operation carried out during the step of bringing insulating tape assembly 10' and planar metal lead frame 50' into contact with one another in preparation for the bonding step. The size of opening 18 formed in tape assembly 10' will be approximately the size of opening 58 in lead frame assembly 50', which will be slightly larger than the cross-sectional area of the die to be mounted within openings 18 and 58, as shown at dotted lines 100 in FIG. 8, depicting the length and width of such an integrated circuit die. (It will be appreciated that the thickness proportions of the various layers shown in FIGS. 7 and 8 are disproportionate with respect to the thickness of such a die.)

In the embodiment shown in FIGS. 6–8, planar metal lead frame 50', having opening 58 therein is first bonded to insulating tape layer 30' of insulating tape assembly 10' via the curing of b-stage adhesive layer 20', following the process steps previously discussed in connection with the formation of the structure shown in FIG. 2, and metal member 60 is then bonded to the opposite side of insulating tape assembly 10', by curing b-stage adhesive layer 40', in the same manner as previously discussed for the bonding of metal member 60 using b-stage adhesive layer 40.

Following the step of binding metal member 60 to the opposite side of insulating tape assembly 10' to form the structure shown in FIG. 8, a die 100 may be bonded directly to the surface of metal member 60 facing insulating tape assembly 10' and lead frame 50', resulting in the structure shown in FIG. 9. A conductive adhesive such as a conductive epoxy may be used to bond die 100 directly to metal member 60. As in the previous embodiment, an electrical connection 70 may be made between metal member 60 and one lead 52 to provide a ground plane in metal member 60 (if the backside of die 100 is at ground potential), or a power plane at whatever potential it is desired to maintain the backside of die 100.

In yet another embodiment, the structure shown in FIG. 5 may be subject to one or more further steps to bond a second insulating tape assembly 80 on the opposite surface of planar metal lead frame 50, forming the structure shown in FIG. Tape assembly 80 comprises an insulating layer 84 which may be constructed of similar material to insulating layer 30 and may be further provided with a first b-stage adhesive layer 82 and a second b-stage adhesive layer 86.

When such a second tape assembly 80 is used, b-stage adhesive 82 may comprise an adhesive curable at the same temperature as b-stage adhesive layer 20 in first insulating tape assembly 10. Both tape assemblies may then be bonded to the opposite sides of planar metal lead frame 50 at the same time, followed by subsequent bonding of metal member 60 to the opposite surface of first insulating tape assembly 10.

Provision of a second b-stage adhesive 86 on second tape assembly 80 is only optional since, as shown in FIG. 11, die 100 may be bonded to insulating layer 84 of second tape assembly 80 using an appropriate adhesive applied to insulating tape 84 at the time the die is to be bonded to insulting tape assembly 80. Alternatively a b-stage adhesive 86 will be used which is curable at a temperature higher than the curing temperature of b-stage adhesives 20, 40, and 82, yet low enough to not be damaging to die 100.

It should be further noted that another conductive layer could be bonded to second insulating tape assembly 80, if additional conductive layers are needed or desired. Actually the process of the invention could be repeated to form a number of conducting layers separated by insulating layers which have been bonded to the metal layers using b-stage adhesives previously formed on the surfaces of the insulating layers.

Thus, the invention provides an improved method for assembling a multilayer lead frame assembly for use in the formation of plastic encapsulated integrated circuit packages wherein a preassembled metal ground plane/insulating layer/planar metal lead frame subassembly may be bonded to an integrated circuit die and the die electrically connected to the lead frame leads prior to encapsulation in plastic whereby the metal ground plane/insulating layer/lead frame/die assembly is a mechanically strong assembly which may be placed in the plastic encapsulation mold without the need for external means to retain the assembly together prior to encapsulation.

Furthermore, the integrated circuit structures constructed in accordance with the invention which are illustrated in FIGS. 9–11 were tested for heat dissipation in comparison to a conventionally formed plastic-encapsulated integrated circuit structure. The prior art structure was found to have a 33° C. average temperature rise per watt of power, when operated at a 2 watt level. The plastic-encapsulated integrated circuit structures constructed in accordance with the invention, in contrast, had an average 26° C. rise in temperature per watt at the same power level. Logic-type plastic-encapsulated integrated circuit structures constructed in accordance with the invention, such as an 80286 die, were found to operate at faster speeds due to the lower inductance resulting from metal member 60 functioning as a ground plane layer.

For example, a split wafer run of 80286 dies, with one half of the wafer conventionally built into 68PLCC packages (conventionally packaged plastic encapsulated chips with no ground plane) gave a 67% yield to 16 mHz, while the other half of the same wafer packaged in accordance with the invention (using the multilayer lead frame assembly constructed in accordance with the invention) resulted in an 88% yield to 16 mHz.

Having thus described the invention, what is claimed is:

1. A process of making a multilayer lead frame assembly for an integrated circuit structure which comprises:
    a) bonding a first surface of an insulating tape to a planar metal lead frame using a first b-stage adhesive curable at a first temperature; and
    b) bonding a second surface of said insulating tape to a planar metal member capable of serving as a ground plane using a second b-stage adhesive curable at a second temperature different than said first temperature.

2. The process of claim 1 wherein said step of bonding said first surface of said insulating tape to said planar metal lead frame using said first b-stage adhesive curable at said first temperature is carried out first at said first temperature which is lower than said second temperature and said step of bonding said second surface of said insulating tape to said planar metal member capable of serving as a ground plane using said second b-stage adhesive curable at said second temperature is carried out later at a temperature higher than said first temperature.

3. The process of claim 1 wherein said step of bonding said second surface of said insulating tape to said planar metal member capable of serving as a ground plane using said second b-stage adhesive curable at said second temperature is carried out before said step of bonding said first surface of said insulating tape to said planar metal lead frame using said first b-stage adhesive curable at said first temperature, and said second temperature used to bond said planar metal member to said second surface of said insulating tape is lower than said first temperature used to bond said first surface of said insulating layer to said lead frame.

4. The process of claim 2 wherein said step of bonding said first surface of said insulating layer to said planar metal lead frame further comprises:
   a) contacting said planar metal lead frame with a b-stage adhesive curable at said first temperature comprising said first surface of said insulating layer; and
   b) heating said lead frame and said insulating tape to said first temperature to bond said insulating tape to said lead frame by curing said b-stage adhesive.

5. The process of claim 4 wherein said step of bonding said second surface of said insulating tape to said planar metal member capable of serving as a ground plane further comprises:
   a) contacting said planar metal member with a layer of a second b-stage adhesive curable at a second temperature which is higher than said first b-stage adhesive comprising said second surface of said insulating tape; and
   b) heating said metal member and said insulating tape having said planar metal lead frame already bonded thereto to said second temperature to bond said metal member to said insulating tape by curing said second b-stage adhesive.

6. The process of claim 1 wherein said planar metal member capable of serving as a ground plane is electrically connected to at least one lead on said planar metal lead frame.

7. A process of making a multilayer lead frame assembly for an integrated circuit structure containing a planar metal member capable of serving as both a ground plane and a heat sink which comprises:
   a) bonding a planar metal lead frame to one surface of an insulating tape having a first b-stage adhesive curable at a first temperature on said one surface of said insulating tape by;
      i) placing said lead frame in contact with said first b-stage adhesive on said one surface of said insulating tape; and
      ii) heating said lead frame and said insulating tape to said first temperature to cure said first b-stage adhesive to bond said lead frame and said insulating tape together by said curing of said first b-stage adhesive; and
   b) bonding a planar metal member capable of serving as both a ground plane and a heat sink to a opposite surface of said insulating layer having a second b-stage adhesive thereon curable at a second temperature different than said first temperature by:
      i) placing said metal member in contact with said second b-stage adhesive on said opposite surface of said insulating tape; and
      ii) heating said metal member and said insulating layer to said second temperature to cure said second b-stage adhesive to bond said metal member and insulating tape together by said curing of said second b-stage adhesive.

8. The process of claim 7 wherein said first temperature at which said first b-stage adhesive is curable is lower than said second temperature at which said second b-stage adhesive is curable; said step of bonding said planar metal lead frame to said insulating tape by heating said lead frame and said insulating layer to said first curing temperature of said first b-stage adhesive is carried out prior to said step of bonding said planar metal member o said insulating layer; and said step of bonding said planar metal member to said insulating layer is subsequently carried out at said higher second curing temperature of said second b-stage adhesive.

9. The process of claim 7 wherein said second curing temperature at which said second b-stage adhesive is curable is lower than said first curing temperature of said first b-stage adhesive; said step of bonding said planar metal member to said insulating layer is carried out at said lower second curing temperature of said second b-stage adhesive prior to said step of bonding said planar metal lead frame to said insulating layer; and said step of bonding said planar metal lead frame to said insulating tape is subsequently carried out by heating said lead frame and said insulating layer to said higher first curing temperature of said first b-stage adhesive.

10. The process of claim 7 including the further step of bonding an integrated circuit die directly to a central portion of an opposite surface of said planar metal lead frame.

11. The process of claim 7 wherein said planar metal lead frame is provided with a central opening therein larger than the dimensions of an integrated circuit die and a central opening of approximately the same dimensions is formed in said insulating tape in registry with said opening in said metal lead frame; and said process includes the subsequent step of bonding said integrated circuit die to a central portion of the surface of said planar metal member facing said opposite surface of said insulating layer.

12. A process of making a multilayer lead frame assembly for an integrated circuit structure containing a planar metal member capable of serving as both a ground plane and a heat sink which comprises:
   a) bonding a planar metal lead frame to one surface of an insulating tape having a first b-stage adhesive thereon capable of curing at a first temperature on said one surface of said insulating tape by;
      i) placing said lead frame in contact with said first b-stage adhesive on said one surface of said insulating tape; and
      ii) heating said lead frame and said insulating tape to said first temperature to bond said lead frame to said insulating tape by curing said first b-stage adhesive; and
   b) bonding a planar metal member capable of serving as both a ground plane and a heat sink to a opposite surface of said insulating layer having a second b-stage adhesive thereon capable of curing at a second temperature higher than said first temperature by:
      i) placing said metal member in contact with said second b-stage adhesive on said opposite surface of said insulating tape; and
      ii) heating said metal member and said insulating layer having said planar metal lead frame already bonded thereto to said second temperature to bond said metal member and said insulating tape together by curing said second b-stage adhesive.

13. The process of claim 12 including the further step of electrically connecting at least one lead on said planar metal lead frame to said planar metal member.

14. The process of claim 13 including the further steps of;
   a) bonding one surface of a second insulating tape to the central portion of an opposite surface of said planar metal lead frame; and
   b) bonding an integrated circuit die to the opposite surface of said second insulating tape.

15. The process of claim 14 wherein said second insulating tape is provided with a third b-stage adhesive on said one surface thereof curable at the same temperature as said first b-stage adhesive on said first insulating tape whereby said second insulating layer may be bonded to said opposite surface of said planar metal lead frame at the same time as said first insulating tape is bonded to said lead frame by said curing of said first b-stage adhesive.

16. The process of claim 14 including the further encapsulating said planar metal member/first insulating tape/planar metal lead frame/second insulating tape/integrated circuit die assembly in a plastic encapsulant.

17. The process of claim 12 including the further step of bonding an integrated circuit die directly to the central portion of an opposite surface of said planar metal lead frame.

18. The process of claim 17 wherein said step of bonding said integrated circuit die directly to said central portion of said planar metal lead frame further includes the use of a conductive adhesive to bond said integrated circuit die to said central portion of said lead frame.

19. The process of claim 18 including the further step of electrically connecting at least one lead on said planar metal lead frame to said planar metal member.

20. The process of claim 19 including the further step of encapsulating said planar metal member/insulating tape/planar metal lead frame/integrated circuit die assembly in a plastic encapsulant.

21. The process of claim 12 wherein said planar metal lead frame is provided with a central opening therein slightly larger than the dimensions of an integrated circuit die and a central opening of approximately the same dimensions is formed in said insulating tape prior to said step of heating said lead frame and said insulating tape to said first temperature to bond said lead frame and said insulating tape together by curing said first b-stage adhesive.

22. The process of claim 21 including the further step of bonding said integrated circuit die to a central portion of the surface of said planar metal member facing said opposite surface of said insulating layer.

23. The process of claim 22 wherein said step of bonding said integrated circuit die directly to said central portion of said surface of said planar metal member facing said opposite surface of said insulating layer further includes the use of a conductive adhesive to bond said integrated circuit die to said metal member.

24. The process of claim 23 including the further step of encapsulating said planar metal member/insulating tape/planar metal lead frame and integrated circuit die assembly in a plastic encapsulant.

* * * * *